United States Patent
Lin

(10) Patent No.: US 9,500,417 B2
(45) Date of Patent: Nov. 22, 2016

(54) THERMAL MODULE CONNECTION STRUCTURE

(71) Applicant: ASIA VITAL COMPONENTS CO., LTD., Sinjhuang District, New Taipei (TW)

(72) Inventor: Sheng-Huang Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 286 days.

(21) Appl. No.: 13/906,295

(22) Filed: May 30, 2013

(65) Prior Publication Data

US 2014/0352919 A1 Dec. 4, 2014

(51) Int. Cl.
*F28F 7/00* (2006.01)
*F28D 15/00* (2006.01)
*F28F 9/26* (2006.01)

(52) U.S. Cl.
CPC ..................................... *F28F 9/26* (2013.01)

(58) Field of Classification Search
CPC .................. H01L 23/40; H01L 23/34; H01L 2023/4075; H01L 2023/4081; H01L 2023/4087; H01L 2023/4093; H05K 7/20; F25D 2021/0029; F25D 2021/0028
USPC ......... 165/80.3, 80.1, 80.2, 104.33; 361/610, 361/678, 679.02, 679.04, 679.46, 679.58, 361/709
See application file for complete search history.

(56) References Cited

U.S. PATENT DOCUMENTS

| | | | | |
|---|---|---|---|---|
| 5,771,155 A * | 6/1998 | Cook | ................. | H01L 23/4093 248/510 |
| 6,344,971 B1 * | 2/2002 | Ju | ....................... | H01L 23/4093 165/185 |
| 6,421,242 B1 * | 7/2002 | Chen | .................. | H01L 23/4093 165/80.3 |
| 6,449,157 B1 * | 9/2002 | Chu | ..................... | H01L 23/4093 165/185 |
| 6,618,253 B1 * | 9/2003 | Szu | ..................... | H01L 23/4093 257/719 |
| 6,707,672 B2 * | 3/2004 | Liu | ..................... | H01L 23/4006 165/185 |

(Continued)

FOREIGN PATENT DOCUMENTS

CN 101304644 A 11/2008

*Primary Examiner* — Len Tran
*Assistant Examiner* — Claire Rojohn, III
(74) *Attorney, Agent, or Firm* — C. G. Mersereau; Nikolai & Mersereau, P.A.

(57) ABSTRACT

A thermal module connection structure providing a substrate, a heat generation unit disposed on the substrate, includes: a heat dissipation unit disposed on the heat generation unit, a protrusion section outward extending from each of two sides of the heat dissipation unit; and a locating assembly including a first locating member and a second locating member mounted on two sides of the heat generation unit, which sides are free from the protrusion sections. A carrier member is disposed at each of two ends of the first locating member. The protrusion sections of the heat dissipation unit are positioned on the carrier members. One end of the carrier member is pivotally connected with the first locating member, while the other end is latched with the second locating member. The carrier member has a press member for pressing the protrusion section against the carrier member to fix the heat dissipation unit.

8 Claims, 10 Drawing Sheets

(56) References Cited

U.S. PATENT DOCUMENTS

| | | | | |
|---|---|---|---|---|
| 6,822,869 B2* | 11/2004 | Huang | H01L 23/4093 165/185 |
| 6,934,157 B2* | 8/2005 | Figuerado | H01L 23/4093 165/185 |
| 7,286,363 B2* | 10/2007 | Lee | H01L 23/4093 165/80.2 |
| 7,292,444 B1* | 11/2007 | Yang | H01L 23/4093 24/458 |
| 7,768,784 B2* | 8/2010 | Lai | H01L 23/4093 165/104.33 |
| 9,118,141 B2* | 8/2015 | Yeh | H01R 13/533 |
| 2003/0214787 A1* | 11/2003 | Liu | H01L 23/4006 361/704 |
| 2008/0037220 A1* | 2/2008 | Hsieh | 361/695 |
| 2008/0174968 A1* | 7/2008 | Feng | H01L 23/4093 361/720 |
| 2009/0034205 A1* | 2/2009 | Li et al. | 361/709 |
| 2010/0015821 A1* | 1/2010 | Hsu et al. | 439/66 |
| 2013/0078827 A1* | 3/2013 | Yeh | H01R 12/88 439/76.1 |
| 2013/0322037 A1* | 12/2013 | Tan | H05K 7/10 361/752 |

* cited by examiner

THERMAL MODULE CONNECTION STRUCTURE

BACKGROUND OF THE INVENTION

1. Field of the Invention

The present invention relates generally to a thermal module connection structure, and more particularly to a thermal module connection structure, which is convenient to install/uninstall and is manufactured at lower cost.

2. Description of the Related Art

In recent years, along with the rapid advance of computer sciences and technologies, the operation speed of a computer has become faster and faster. Accordingly, the heat generation power of the electronic components inside the computer case has become higher and higher. In case of overheating of the electronic components inside the computer case, the electronic components will temporarily or even permanently fail. Therefore, it is critical to efficiently dissipate the heat generated by the electronic components inside the computer case.

With a central processing unit (CPU) taken as an example, in case that the temperature of the CPU rises to exceed a normal working temperature range, the CPU is very likely to malfunction and temporarily fail. This will lead to crash of the computer case. Moreover, in case that the temperature of the CPU is much higher than the normal working temperature range, the transistors inside the CPU chip may even damage. Under such circumstance, the CPU will permanently fail. In this case, it is necessary to replace the CPU so as to restore the computer case to the normal operation state.

A conventional thermal module mainly includes two parts, that is, a heat sink and a cooling fan. The heat sink has two heat contact faces. The first heat contact face is a heat conduction face between the heat generation electronic component and the bottom of the heat sink. The second heat contact face is a heat convection face between the radiating fins of the heat sink and the cooling fan. In order to achieve maximum heat conduction efficiency, the bottom of the heat sink must tightly attach to the heat generation electronic component without any gap between the bottom of the heat sink and the heat generation electronic component. Otherwise, no matter how high the performance of the thermal module is, the heat dissipation efficiency will be deteriorated.

The thermal module is generally securely fixed on the heat generation electronic component by means of a latch device. The latch device is able to make the bottom of the heat sink in tight contact with the heat generation electronic component so as to achieve maximum heat conduction efficiency. Please refer to FIGS. 1A and 1B. FIG. 1A is a perspective exploded view of a conventional thermal module connection structure. FIG. 1B is a perspective assembled view of the conventional thermal module connection structure. The thermal module connection structure includes a substrate 90. A heat generation electronic component 91 is disposed on one face of the substrate 90. A heat dissipation unit 92 is attached to the heat generation electronic component 91 for dissipating the heat generated by the heat generation electronic component 91. The thermal module connection structure further includes a latch member 93. Each of two ends of the latch member 93 is formed with at least one perforation 931. Two opposite sides of the substrate 90 are provided with raised sections 901. The raised sections 901 are assembled with the perforations 931 of the latch member 93 so as to latch the heat dissipation unit 92 with the heat generation electronic component 91.

The conventional latch member has a complicated structure. Moreover, all the parts of the conventional thermal module connection structure must be independently manufactured with different molds and then assembled. The costs for the equipment, the material and the labor are quite high. Especially, different manufacturers manufacture different specifications of heat generation electronic components and package the heat generation electronic components by means of different techniques. Different latch members require different latching pressure and cannot be commonly used. In the case that a specific latch member is installed on thermal module with a different specification, the heat generation electronic component is often damaged. That is, with respect to different specifications of heat generation electronic components, different specifications of latch members in adaptation to the heat generation electronic components must be respectively manufactured with different molds. Therefore, the manufacturing cost is increased and the manufacturing process is complicated. Moreover, the difficulty in assembling the latch member is increased. Also, it is hard to install the latch member. When installed, an operator must first place the heat dissipation unit (heat sink) onto the heat generation electronic component and then use the latch member and other retainer members one by one to latch and connect the heat dissipation unit with the heat generation electronic component. When uninstalled, it is necessary to reversely detach the latch member and the retainer members one by one. This causes great inconvenience and trouble in use and installation of the thermal module.

According to the above, the conventional thermal module connection structure has the following shortcomings:

1. It is quite inconvenient to install/uninstall the thermal module.
2. The manufacturing cost for the conventional thermal module connection structure is higher.
3. The conventional thermal module connection structure cannot be commonly used.

SUMMARY OF THE INVENTION

It is therefore a primary object of the present invention to provide a thermal module connection structure, which is convenient to install/uninstall.
and is manufactured at lower cost It is a further object of the present invention to provide the above thermal module connection structure, which is manufactured at lower cost.

To achieve the above and other objects, the thermal module connection structure of the present invention includes a substrate, a heat dissipation unit and a locating assembly. A heat generation unit is disposed on one face of the substrate. The heat dissipation unit is disposed on the heat generation unit, a protrusion section outward extending from each of at least two sides of the heat dissipation unit. The locating assembly includes a first locating member and a second locating member. The first and second locating members are respectively mounted on two sides of the heat generation unit, which sides are free from the protrusion sections. A carrier member is disposed at each of two ends of the first locating member. The protrusion sections of the heat dissipation unit are positioned on the carrier members. One end of the carrier member is pivotally connected with the first locating member. The other end of the carrier member is latched with the second locating member. The carrier member has a press member for elastically pressing the protrusion section against the carrier member so as to fix the heat dissipation unit on the carrier member.

The end of the carrier member is pivotally connected with the first locating member so that the carrier member can be pivotally rotated relative to the first locating member to latch with the second locating member. Accordingly, the heat dissipation unit can be conveniently and easily installed and uninstalled.

The thermal module connection structure of the present invention is commonly applicable to various heat dissipation units. Therefore, with respect to different types of heat generation electronic components, it is no more necessary to manufacture different specifications of latch members with different molds. Accordingly, the manufacturing cost is greatly lowered.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
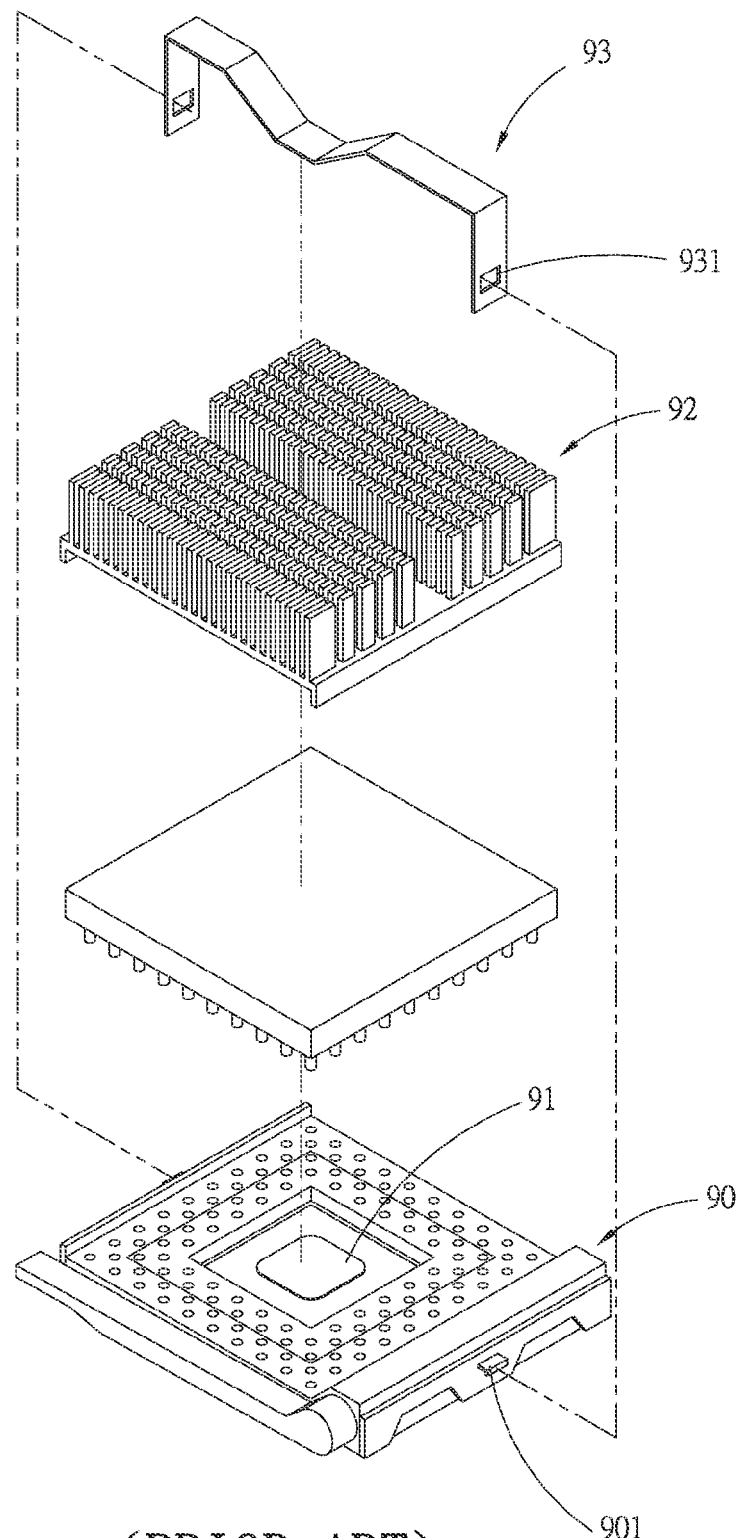
FIG. 1A is a perspective exploded view of a conventional thermal module connection structure.
Figure 1B:
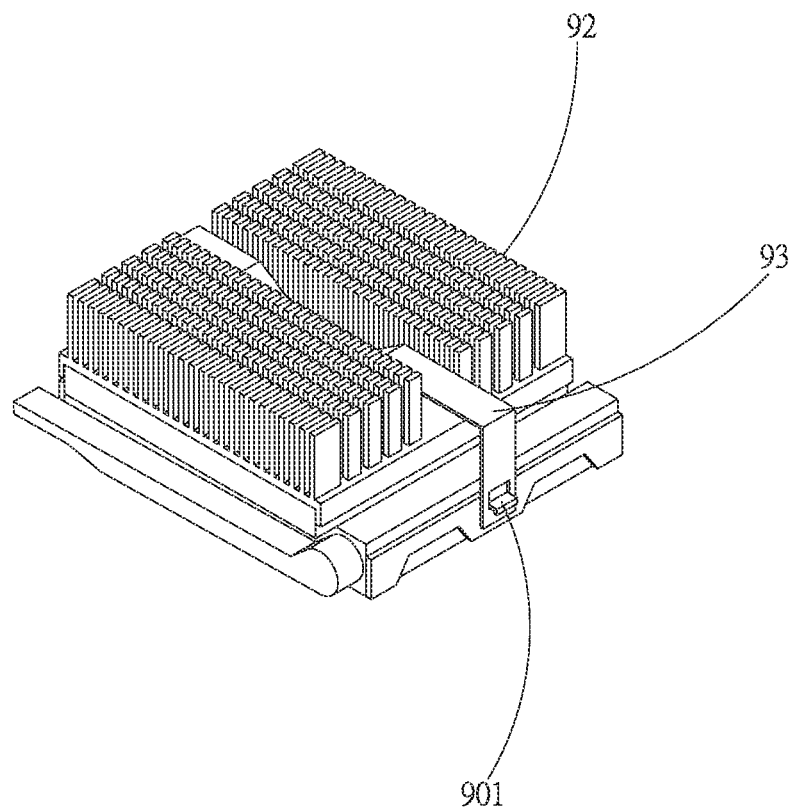
FIG. 1B is a perspective assembled view of the conventional thermal module connection structure.
Figure 2A:
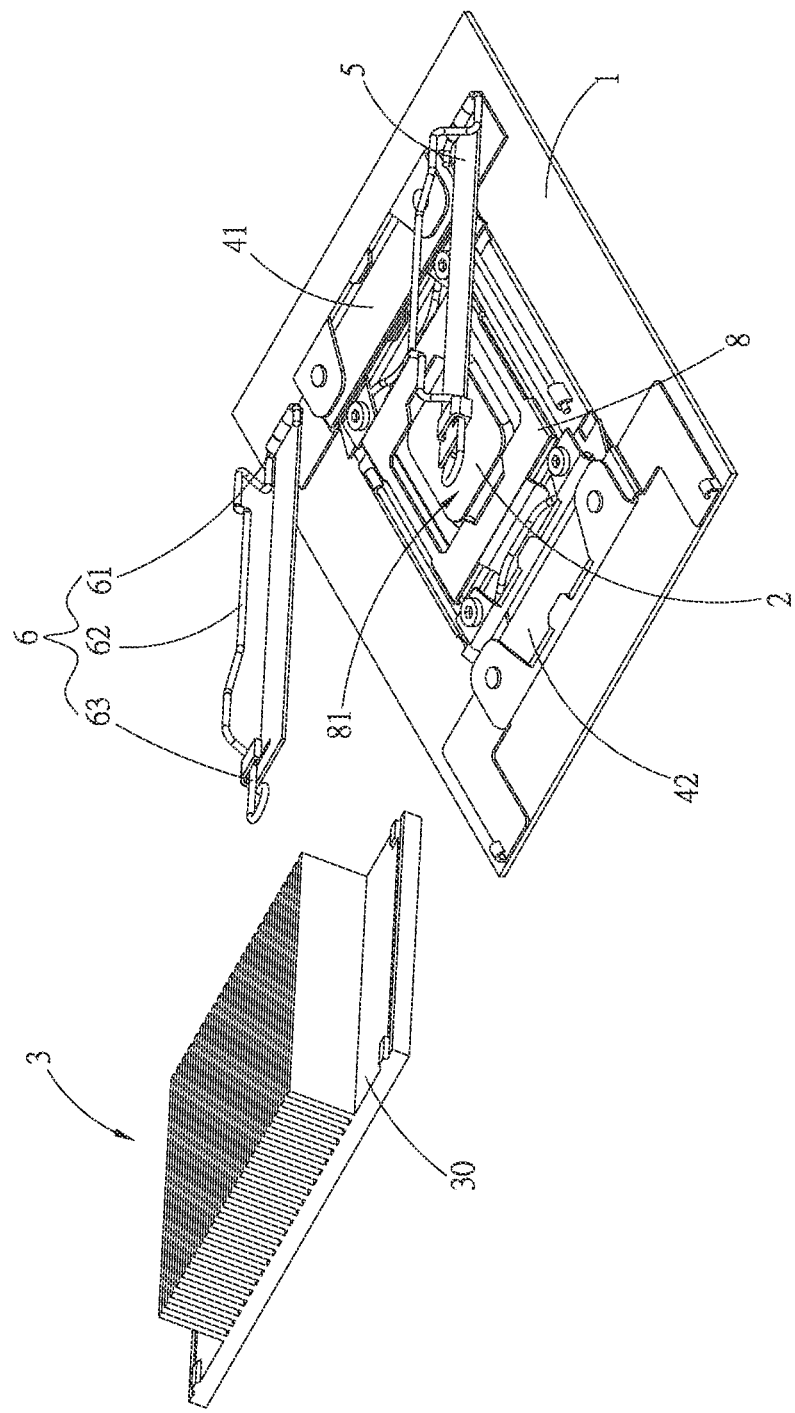
FIG. 2A is a perspective exploded view of a first embodiment of the thermal module connection structure of the present invention.
Figure 2B:
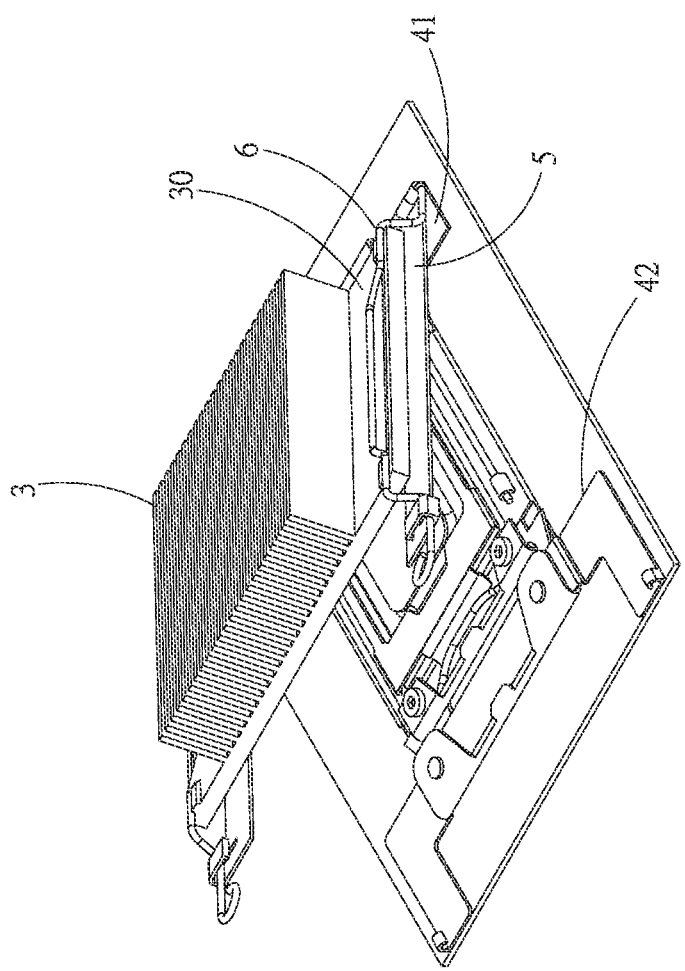
FIG. 2B is a perspective assembled view of the first embodiment of the thermal module connection structure of the present invention.
Figure 2C:
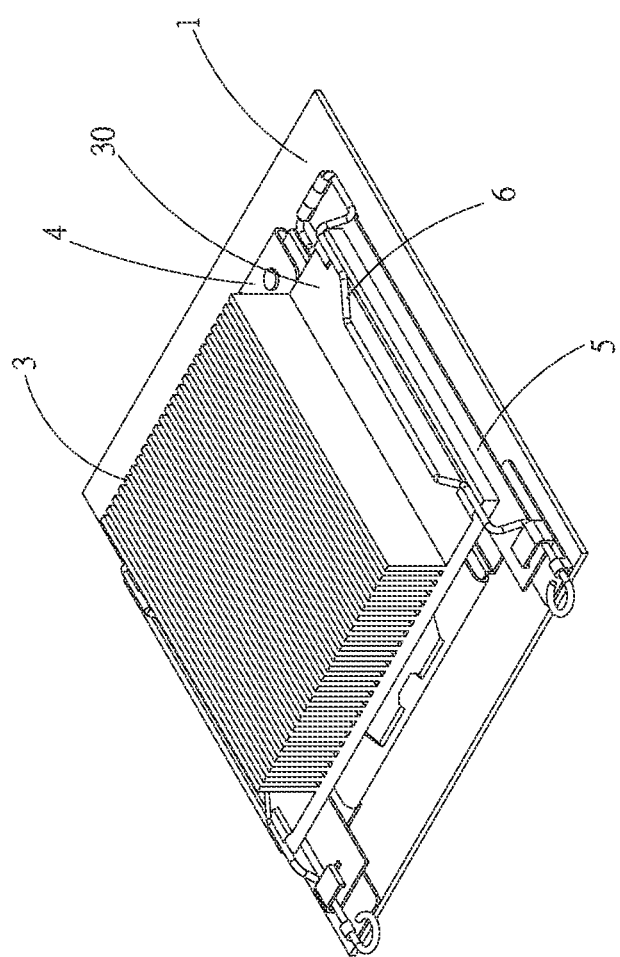
FIG. 2C is another perspective assembled view of the first embodiment of the thermal module connection structure of the present invention.

Please refer to FIGS. 2A, 2B and 2C. FIG. 2A is a perspective exploded view of a first embodiment of the thermal module connection structure of the present invention. FIG. 2B is a perspective assembled view of the first embodiment of the thermal module connection structure of the present invention. FIG. 2C is another perspective assembled view of the first embodiment of the thermal module connection structure of the present invention. According to the first embodiment, the thermal module connection structure of the present invention includes a substrate 1. A heat generation unit 2 is disposed on one face of the substrate 1. The thermal module connection structure of the present invention further includes a heat dissipation unit 3 and a locating assembly 4. The heat dissipation unit 3 is disposed on the heat generation unit 2. A protrusion section 30 outward extends from each of at least two sides of the heat dissipation unit 3. The heat dissipation unit 3 is a heat sink or a radiating fin assembly.

The locating assembly 4 includes a first locating member 41 and a second locating member 42. The first and second locating members 41, 42 are respectively mounted on two sides of the heat generation unit 2, which sides are free from the protrusion sections 30. The first and second locating members 41, 42 are made of metal material or nonmetal material.

A carrier member 5 is mounted at each of two ends of the first locating member 41. The carrier member 5 is made of metal material or nonmetal material. The protrusion sections 30 of the heat dissipation unit 3 are positioned on the carrier members 5. One end of the carrier member 5 is elastically pivotally connected with the first locating member 41. (For example, an elastic member can be additionally mounted at the end of the carrier member 5 to provide elastic restoring force for the carrier member 5). The other end of the carrier member 5 is latched with the second locating member 42. The carrier member 5 has a press member 6 for pressing the protrusion section 30 against the carrier member 5 so as to fix the heat dissipation unit 3 on the carrier member 5. The press member 6 is made of metal material or nonmetal material.

The thermal module connection structure of the present invention further includes a fixing unit 8 having a central receiving space 81 for receiving the heat generation unit 2. The press member 6 is formed with a pivoted section 61, a press section 62 connected with the pivoted section 61 and a latch section 63 connected with the press section 62.

According to the above arrangement, when assembled, the heat dissipation unit 3 is first placed onto the carrier members 5. Then the press members 6 are pressed down into contact with the heat dissipation unit 3, whereby the protrusion sections 30 of the heat dissipation unit 3 are pressed and fixed by the press sections 62. Under such circumstance, the heat dissipation unit 3 is fixed on the carrier members 5. The end of the carrier member 5 is pivotally connected with the first locating member 41 so that the carrier member 5 can be pivotally rotated relative to the first locating member 41 to latch with the second locating member 42. Accordingly, the heat dissipation unit 3 can be conveniently and easily installed and uninstalled.

Moreover, the thermal module connection structure of the present invention is commonly applicable to various heat dissipation units. Therefore, with respect to different types of heat generation electronic components, it is no more necessary to manufacture different specifications of latch members with different molds. Accordingly, the manufacturing cost is greatly lowered.

Figure 3:
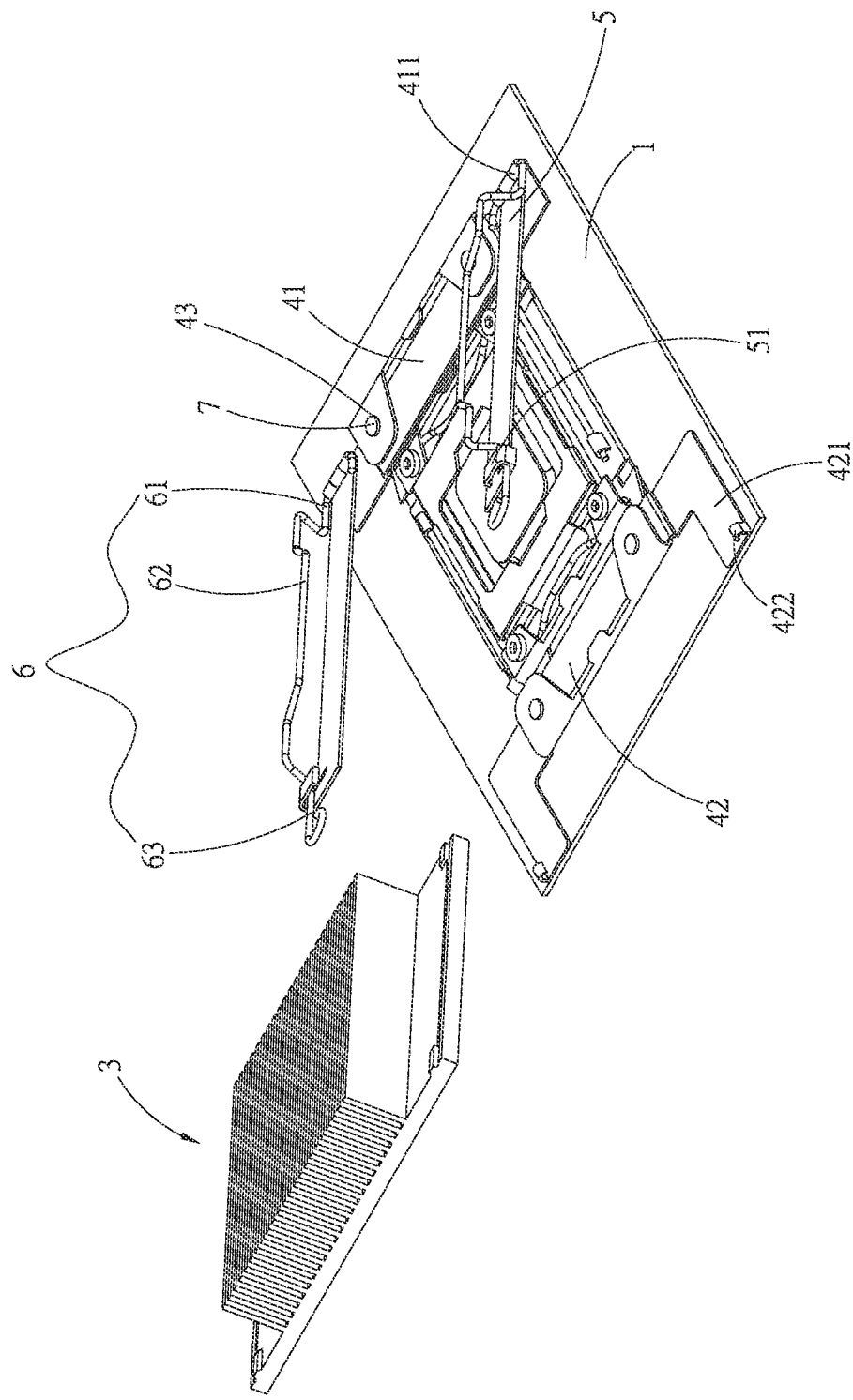
FIG. 3 is a perspective exploded view of a second embodiment of the thermal module connection structure of the present invention.

Please now refer to FIG. 3, which is a perspective exploded view of a second embodiment of the thermal module connection structure of the present invention. The second embodiment is partially identical to the first embodiment in component and connection relationship between the components and thus will not be repeatedly described hereinafter. The second embodiment is different from the first embodiment in that each of two ends of the first locating member 41 has an upward extending assembling section 411. The pivoted section 61 is pivotally connected with the assembling section 411. The other end of the carrier member 5 opposite to the end of the carrier member 5, which end is pivotally connected with the assembling section 411, is formed with a holding section 51. The latch section 63 is latched in the holding section 51.

Further referring to FIG. 3, each of two ends of the second locating member 42 is formed with an extension section 421. A latch hook 422 upward protrudes from the extension section 421. The latch section 63 of the press member 6 is latched in the latch hook 422 so as to securely fix the heat dissipation unit 3 on the substrate 1.

In addition, the first and second locating members 41, 42 are formed with multiple holes 43. Multiple fixing members 7 are passed through the holes 43 to fix the first and second locating members 41, 42 on the substrate 1. The fixing members 7 are made of metal material or nonmetal material. In this embodiment, the fixing members 7 are, but not limited to, rivets for illustration purposes only. In practice, the fixing member 7 can be any member that is able to fix the first and second locating members 41, 42 on the substrate 1, such as a screw or an insertion pin.

Figure 4A:
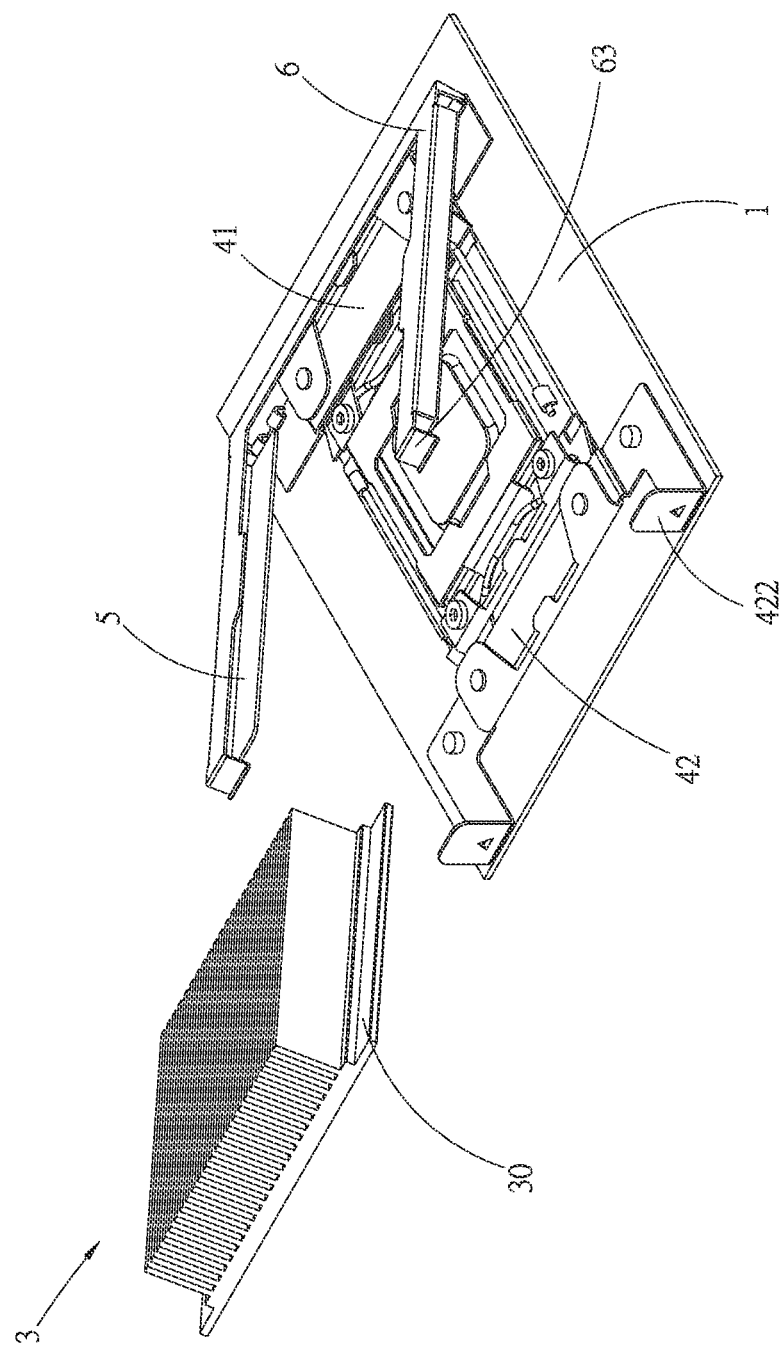
FIG. 4A is a perspective exploded view of a third embodiment of the thermal module connection structure of the present invention.
Figure 4B:
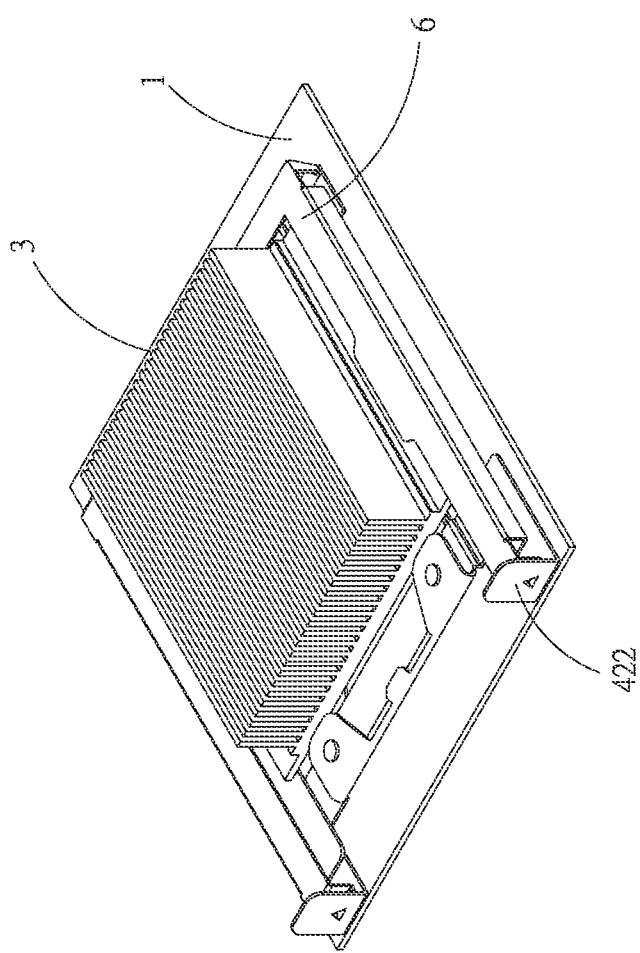
FIG. 4B is a perspective assembled view of the third embodiment of the thermal module connection structure of the present invention.

Please now refer to FIGS. 4A and 4B. FIG. 4A is a perspective exploded view of a third embodiment of the thermal module connection structure of the present invention. FIG. 4B is a perspective assembled view of the third embodiment of the thermal module connection structure of the present invention. The third embodiment is partially identical to the first embodiment in component and connection relationship between the components and thus will not be repeatedly described hereinafter. The third embodiment is different from the first embodiment in that the press member 6 is an elongated L-shaped member. The press member 6 is pivotally connected with the first locating member 41. Each of two free ends of the press member 6 is formed with a latch section 63. When assembled, the heat dissipation unit 3 is first placed into the press member 6 from one side thereof and then the protrusion sections 30 of the heat dissipation unit 3 are pressed by and engaged in the press member 6. Then the latch sections 63 of the press member 6 are latched with the latch hooks 422 of the second locating member 42 so as to securely fix the heat dissipation unit 3 on the substrate 1. Accordingly, the heat dissipation unit 3 can be conveniently and easily installed and uninstalled.

Figure 5A:
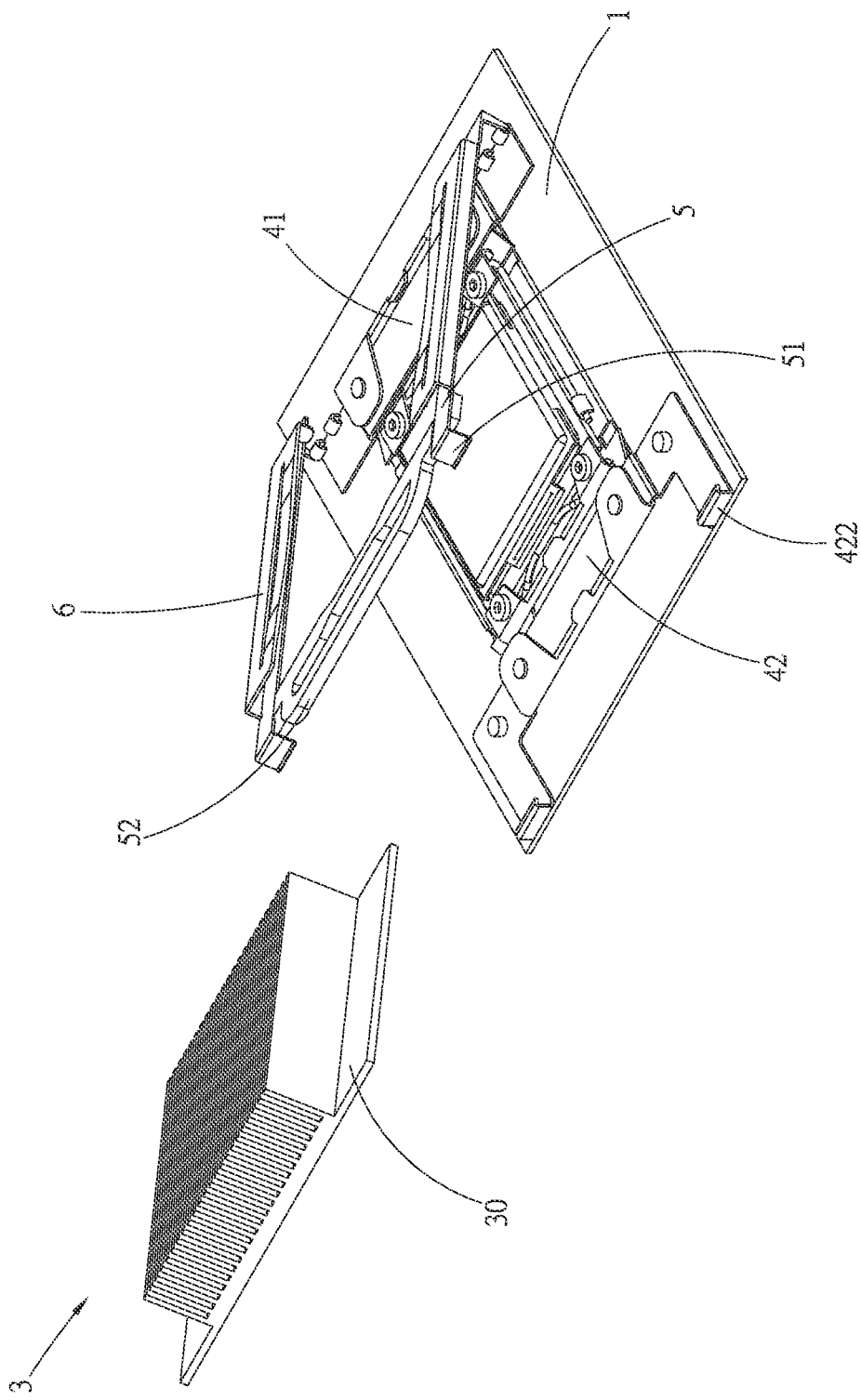
FIG. 5A is a perspective exploded view of a fourth embodiment of the thermal module connection structure of the present invention.
Figure 5B:
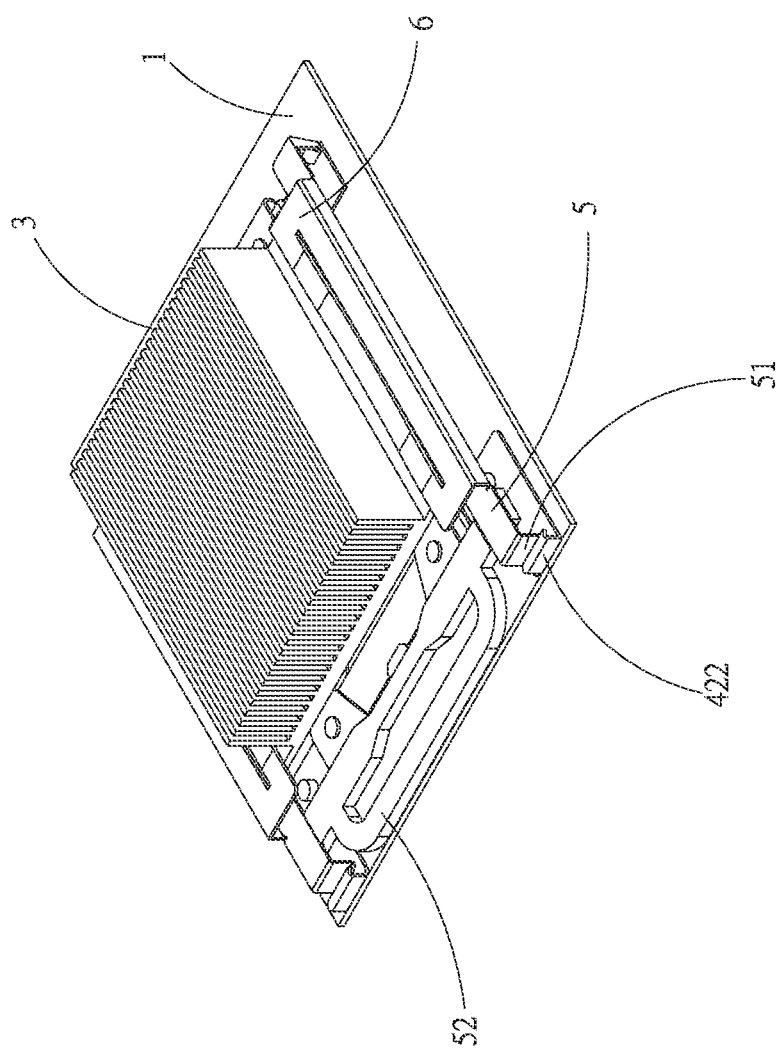
FIG. 5B is a perspective assembled view of the fourth embodiment of the thermal module connection structure of the present invention.

Please now refer to FIGS. 5A and 5B. FIG. 5A is a perspective exploded view of a fourth embodiment of the thermal module connection structure of the present invention. FIG. 5B is a perspective assembled view of the fourth embodiment of the thermal module connection structure of the present invention. The fourth embodiment is partially identical to the first embodiment in component and connection relationship between the components and thus will not be repeatedly described hereinafter. The fourth embodiment is different from the first embodiment in that the carrier member 5 further has an operation section 52. Two ends of the operation section 52 are respectively connected with the ends of the two carrier members 5. Alternatively, the holding sections 51 are directly connected to form a shift section. When assembled, the heat dissipation unit 3 is first placed into the press member 6 from one side thereof and then the protrusion sections 30 of the heat dissipation unit 3 are pressed by and engaged in the press member 6. Then the operation section 52 or the shift section is pressed down to make the holding section 51 latched with the latch hooks 422 of the second locating member 42. Accordingly, the heat dissipation unit 3 can be securely fixed on the substrate 1 with one single hand.

The end of the carrier member 5 is pivotally connected with the first locating member 41 so that the carrier member 5 can be pivotally rotated relative to the first locating member 41 to latch with the second locating member 42. Accordingly, the heat dissipation unit 3 can be conveniently and easily installed and uninstalled.

In conclusion, in comparison with the conventional thermal module connection structure, the present invention has the following advantages:
1. It is easy and convenient to install/uninstall the thermal module.
2. The manufacturing cost for the thermal module connection structure of the present invention is lower.
3. The thermal module connection structure of the present invention can be commonly used.

The present invention has been described with the above embodiments thereof and it is understood that many changes and modifications in the above embodiments can be carried out without departing from the scope and the spirit of the invention that is intended to be limited only by the appended claims.

What is claimed is:

1. A thermal module connection structure providing a substrate, a heat generation unit being disposed on one face of the substrate, the thermal module connection structure comprising:
   a heat dissipation unit disposed on the heat generation unit, a protrusion section outward extending from each of at least two sides of the heat dissipation unit; and
   a locating assembly including a first locating member and a second locating member, the first and second locating members being respectively mounted on two sides of the heat generation unit and attached to the substrate, the sides of the heat generation unit being free from the protrusion sections, two separate independent carrier members in the form of plate members being separately hinged at two ends of the first locating member, the protrusion sections of the heat dissipation unit being positioned on the two carrier members, a first end of each of the two carrier members being separately pivotally connected with a different end of each of the first locating member, a second end of each of the two carrier members being latched with the second locating member, each of the carrier members having a press member for pressing the protrusion section against the carrier member so as to fix the heat dissipation unit on the carrier member;
   wherein the press member is formed with a pivoted section, a rod-shaped press section connected with the pivoted section and a latch section connected with the press section, the press section serving to press the protrusion section against the carrier member so as to fix the heat dissipation unit on the carrier member;
   wherein each of two ends of the first locating member has an upward extending assembling section, the pivoted section being pivotally connected with the assembling section;
   wherein the opposite end of the upward extending assembling section is formed with a holding section;
   wherein the latch section of the press member is latched in the holding section; and
   wherein each of two ends of the second locating member is formed with an extension section, a latch hook upward protruding from the extension section, the latch section of the press member being latched in the latch hook; and
   wherein the second end of each carrier member further is attached to a separate operation section, two ends of the operation section being respectively connected between the second ends of the two carrier members.

2. The thermal module connection structure as claimed in claim 1, further comprising a fixing unit having a central receiving space for receiving the heat generation unit.

3. The thermal module connection structure as claimed in claim 1, wherein the heat dissipation unit is a heat sink or a radiating fin assembly.

4. The thermal module connection structure as claimed in claim 1, wherein the first and second locating members are made of metal material or nonmetal material.

5. The thermal module connection structure as claimed in claim 1, wherein the carrier member is made of metal material or nonmetal material.

6. The thermal module connection structure as claimed in claim 1, wherein the press member is made of metal material or nonmetal material.

7. The thermal module connection structure as claimed in claim 1, wherein the first and second locating members are formed with multiple holes, multiple fixing members being passed through the holes to fix the first and second locating members on the substrate.

8. The thermal module connection structure as claimed in claim 7, wherein the fixing members are screws, rivets or insertion pins.

* * * * *